(12) United States Patent
Wang et al.

(10) Patent No.: US 11,989,367 B2
(45) Date of Patent: May 21, 2024

(54) DISPLAY PANEL AND DISPLAY APPARATUS

(71) Applicants: Chengdu BOE Optoelectronics Technology Co., Ltd., Sichuan Province (CN); BOE Technology Group Co., Ltd., Beijing (CN)

(72) Inventors: Zhu Wang, Beijing (CN); Ling Shi, Beijing (CN); Fei Fang, Beijing (CN)

(73) Assignees: CHENGDU BOE OPTOELECTRONICS TECHNOLOGY CO., LTD., Sichuan Province (CN); BOE TECHNOLOGY GROUP CO., LTD., Beijing (CN)

( * ) Notice: Subject to any disclaimer, the term of this patent is extended or adjusted under 35 U.S.C. 154(b) by 67 days.

(21) Appl. No.: 17/757,208

(22) PCT Filed: Aug. 27, 2021

(86) PCT No.: PCT/CN2021/114954
§ 371 (c)(1),
(2) Date: Jun. 10, 2022

(87) PCT Pub. No.: WO2022/170754
PCT Pub. Date: Aug. 18, 2022

(65) Prior Publication Data
US 2023/0350516 A1 Nov. 2, 2023

(30) Foreign Application Priority Data

Feb. 9, 2021 (WO) ................ PCT/CN2021/076180

(51) Int. Cl.
*G06F 3/041* (2006.01)
*G06F 3/044* (2006.01)
*H10K 59/40* (2023.01)

(52) U.S. Cl.
CPC .......... *G06F 3/04164* (2019.05); *G06F 3/044* (2013.01); *H10K 59/40* (2023.02); *G06F 2203/04107* (2013.01)

(58) Field of Classification Search
CPC .... G06F 3/0412; G06F 3/0446; G06F 3/0443; G06F 3/0445; G06F 3/044;
(Continued)

(56) References Cited

U.S. PATENT DOCUMENTS

| 2015/0145808 A1 | 5/2015 | Cho et al. |
| 2015/0212630 A1 | 7/2015 | Naito et al. |

(Continued)

FOREIGN PATENT DOCUMENTS

| CN | 104615296 A | 5/2015 |
| CN | 104808837 A | 7/2015 |

(Continued)

OTHER PUBLICATIONS

Chinese Office Action, dated Sep. 23, 2022, from Chinese Application No. 202010095983.7.

*Primary Examiner* — Dong Hui Liang
(74) *Attorney, Agent, or Firm* — Workman Nydegger

(57) ABSTRACT

Provided are a display panel and a display apparatus. The display panel includes: a substrate; a plurality of touch electrodes at least partially located on the substrate in a display area; a plurality of touch leads located on the substrate, one ends of the touch leads being coupled to the touch electrodes, and the other ends of the touch leads being located in a peripheral area; a plurality of data leads located on the substrate in the peripheral area; and a plurality of shield lines located on the substrate in the peripheral area, orthographic projections of the shield lines on the substrate being located between orthographic projections of the touch leads on the substrate and orthographic projections of the (Continued)

data leads on the substrate, and at least two of the plurality of shield lines in the display panel being connected to each other in a shorted manner.

14 Claims, 11 Drawing Sheets

(58) Field of Classification Search
CPC ............. G06F 3/04164; G06F 3/04166; G06F 3/0448; G06F 3/0416; G06F 3/041; G06F 2203/04107; G06F 2203/04103; G06F 2203/04111; G06F 2203/04112; G06F 2203/04102; G06F 1/16; G06F 13/4068; G09G 2300/0426; G09G 2300/0413; G09G 3/3696; G09G 3/3233; G09G 2320/0233
See application file for complete search history.

(56) References Cited

U.S. PATENT DOCUMENTS

| 2019/0181155 | A1 | 6/2019 | Li et al. |
| 2020/0117313 | A1* | 4/2020 | Zhang ................... G06F 3/0446 |
| 2020/0176540 | A1* | 6/2020 | Park ..................... H01L 27/1218 |
| 2020/0388230 | A1 | 12/2020 | Lee |
| 2020/0393936 | A1 | 12/2020 | Bok et al. |
| 2021/0176903 | A1 | 6/2021 | Tian et al. |
| 2022/0100342 | A1 | 3/2022 | Wang et al. |
| 2022/0206606 | A1* | 6/2022 | Ye ......................... G06F 3/0443 |
| 2022/0216290 | A1 | 7/2022 | Zheng et al. |

FOREIGN PATENT DOCUMENTS

| CN | 104866126 A | 8/2015 |
| CN | 105652498 A | 6/2016 |
| CN | 105824448 A | 8/2016 |
| CN | 106527816 A | 3/2017 |
| CN | 107479283 A | 12/2017 |
| CN | 107958922 A | 4/2018 |
| CN | 108628020 A | 10/2018 |
| CN | 109856874 A | 6/2019 |
| CN | 111341771 A | 6/2020 |
| CN | 211150599 U | 7/2020 |
| CN | 111627932 A | 9/2020 |
| CN | 112054038 A | 12/2020 |
| CN | 112083826 A | 12/2020 |
| CN | 112198983 A | 1/2021 |
| CN | 112768495 A | 5/2021 |
| EP | 3598281 A1 | 1/2020 |

* cited by examiner

DISPLAY PANEL AND DISPLAY APPARATUS

CROSS REFERENCE TO RELATED APPLICATIONS

The present disclosure is a National Stage of International Application No. PCT/CN2021/114954, filed on Aug. 27, 2021, which claims the priority to patent application with priority number being PCT/CN2021/076180, filed on Feb. 9, 2021 and entitled "DISPLAY PANEL AND DISPLAY APPARATUS", both of which are incorporated in their entireties herein by reference.

FIELD

The present disclosure relates to the technical field of display, and in particular to a display panel and a display apparatus.

BACKGROUND

An organic light-emitting diode (OLED) has the advantages of self-luminescence, fast reaction, wide viewing angle, high brightness, brilliant color, thinness, etc. When the OLED uses a touch display driver integration (TDDI) chip, signal lines such as touch leads and data leads will be both introduced into the TDDI chip. The signal lines such as the touch leads and the data leads are connected to the edge of an OLED display panel and coupled to connection terminals in a binding area at the edge of the OLED display panel, and the TDDI chip is in bound connection to the connection terminals in the binding area, thereby coupling the signal lines such as the touch leads and the data leads to the TDDI chip.

SUMMARY

A display panel provided in an embodiment of the present disclosure includes: a display area and a peripheral area located on at least one side of the display area, and
the display panel further includes:
a substrate;
a plurality of touch electrodes, at least parts of the touch electrodes being on the substrate in the display area;
a plurality of touch leads located on the substrate, one ends of the touch leads being coupled to the touch electrodes, and the other ends of the touch leads being located in the peripheral area;
a plurality of data leads located on the substrate in the peripheral area; and
a plurality of shield lines located on the substrate in the peripheral area, orthographic projections of the shield lines on the substrate being located between orthographic projections of the touch leads on the substrate and orthographic projections of the data leads on the substrate, and at least two of the plurality of shield lines being connected to each other in a shorted manner.

Optionally, in an embodiment of the present disclosure, the shield lines that are connected to each other in a shorted manner are connected in a shorted manner by means of connection lines.

Optionally, in an embodiment of the present disclosure, the connection lines and the shield lines are on a same film layer; and the connection lines do not cross remaining shield lines except the shield lines connected to the connection lines in a shorted manner.

Optionally, in an embodiment of the present disclosure, the connection lines and the shield lines are on different film layers; one end of each of the connection lines is electrically connected to one of the shield lines by means of a first open hole, and the other end of the each of the connection lines is electrically connected to another one of the shield lines by means of a second open hole, where the first open hole penetrates an insulation layer between the connection line and the shield line, and the second open hole penetrates the insulation layer between the connection line and the shield line.

Optionally, in an embodiment of the present disclosure, the display panel further includes: a plurality of connection terminals located on the substrate in the peripheral area, where the touch leads, the data leads and the shield lines are electrically connected to different connection terminals respectively.

Optionally, in an embodiment of the present disclosure, the at least two shield lines that are connected to each other in a shorted manner are electrically connected to a same connection terminal.

Optionally, in an embodiment of the present disclosure, the plurality of touch leads in the display panel are divided into a plurality of touch lead groups, and each of the touch lead groups includes more than one of the plurality of touch leads;
the plurality of data leads in the display panel are divided into a plurality of data lead groups, each of the data lead groups includes more than one of the plurality of data leads, and at least some of the touch lead groups and the data lead groups are alternately distributed; and
the shield lines are in gaps between the touch lead groups and the data lead groups.

Optionally, in an embodiment of the present disclosure, the plurality of shield lines in the display panel include a plurality of ground lines, where
at least one of the ground lines is arranged in a gap between the touch lead group and the data lead group that are adjacent to each other.

Optionally, in an embodiment of the present disclosure, the plurality of shield lines in the display panel further includes: a plurality of floating touch leads, where
at least one of the floating touch leads is arranged in the gap between the touch lead group and the data lead group that are adjacent to each other, and the floating touch leads are located between the ground lines and the touch lead groups.

Optionally, in an embodiment of the present disclosure, the peripheral area includes a first fan-out area, a second fan-out area located on one side away from the display area, of the first fan-out area, and a bending area located between the first fan-out area and the second fan-out area, where
the floating touch leads are in at least one of the first fan-out area, the bending area or the second fan-out area, and
the ground lines are in the second fan-out area.

Optionally, in an embodiment of the present disclosure, each of the shield lines in the gap between the touch lead group and the data lead group that are adjacent to each other is taken as a shield line group; and in two adjacent shield line groups, each of the ground lines is in a gap formed by each of the floating touch leads.

Optionally, in an embodiment of the present disclosure, in two adjacent shield line groups, the ground lines in each of the shield line groups are sorted in sequence from a closer distance to the floating touch leads in the shield line group to a farther distance to same; and in two adjacent shield line groups, an i-th ground line in one of the two adjacent shield line groups is connected to an i-th ground line in the other one of the two adjacent shield line groups in a shorted manner by means of the connection line, wherein the i-th ground line in one of the two adjacent shield line groups, the i-th ground line in the other one of the two adjacent shield line groups and the connection line are on a same film layer, i being a positive integer greater than 0 and less than or equal to a total number of the ground lines in the shield line groups, and the connection line connected to the i-th ground line being on one side, close to the first fan-out area, of the connection line connected to the (i+1)-th ground line.

Optionally, in an embodiment of the present disclosure, in two adjacent shield line groups, the floating touch leads in each of the shield line groups are sorted in sequence from a closer distance to the ground lines in the shield line groups to a farther distance to same; and in two adjacent shield line groups, the first floating touch lead in one of the two adjacent shield line groups is connected to the first floating touch lead in the other one of the two adjacent shield line groups in a shorted manner by means of the connection line, wherein the first floating touch lead in one of the two adjacent shield line groups, the first floating touch lead in the other one of the two adjacent shield line groups and the connection line are on a same film layer, and a j-th floating touch lead in one of the two adjacent shield line groups is connected to a j-th floating touch lead in the other one of the two adjacent shield line groups in a shorted manner by means of a connection wire, wherein the j-th floating touch lead in one of the two adjacent shield line groups, the j-th floating touch lead in the other one of the two adjacent shield line groups and the connection wire are on a different layer, j being a positive integer greater than 1 and less than or equal to a total number of the ground lines in the shield line groups.

Optionally, in an embodiment of the present disclosure, the display panel further includes: a plurality of first electrodes, a plurality of second electrodes located on one side, away from the substrate, of the first electrodes, and a light-emitting layer located between the first electrodes and the second electrodes, wherein orthographic projections of the floating touch leads on the substrate overlaps with orthographic projections of the second electrodes on the substrate, and the orthographic projections of the floating touch leads on the substrate do not overlap with orthographic projections of the touch electrodes on the substrate.

Optionally, in an embodiment of the present disclosure, in the peripheral area, the plurality of data leads in the display panel are divided into a plurality of first data leads located on a first metal layer and a plurality of second data leads located on a second metal layer; the second metal layer is located on one side close to the substrate, of the first metal layer; and orthographic projections of the first data leads on the substrate and orthographic projections of the second data leads on the substrate are alternately distributed.

Optionally, in an embodiment of the present disclosure, the display panel further includes: touch shield lines located on the substrate, where the peripheral area includes: a first peripheral area and a second peripheral area that are oppositely arranged, and a third peripheral area and a fourth peripheral area that are oppositely arranged, the shield lines being located in the first peripheral area; and first ends and second ends of the touch shield lines are in the first peripheral area, and the touch shield lines pass through the second peripheral area, the third peripheral area and the fourth peripheral area, and surround the touch electrodes in the display panel.

Optionally, in an embodiment of the present disclosure, the touch shield lines in the display panel include: a first touch shield line and a second touch shield line, where the second touch shield line being on one side close to the touch electrode, of the first touch shield line.

Optionally, in an embodiment of the present disclosure, the first touch shield lines includes a first touch shield sub-line and at least two second touch shield sub-lines, where the first touch shield sub-line being in the second peripheral area, the third peripheral area and the fourth peripheral area, and the second touch shield sub-lines being coupled to the first touch shield sub-line, and being in the first peripheral area.

Optionally, in an embodiment of the present disclosure, a width of the first touch shield lines is greater than a width of the second touch shield lines in the second peripheral area, the third peripheral area and the fourth peripheral area.

Correspondingly, an embodiment of the present disclosure further provides a display apparatus. The display apparatus includes the display panel of any one above.

DETAILED DESCRIPTION OF THE EMBODIMENTS

Figure 1:
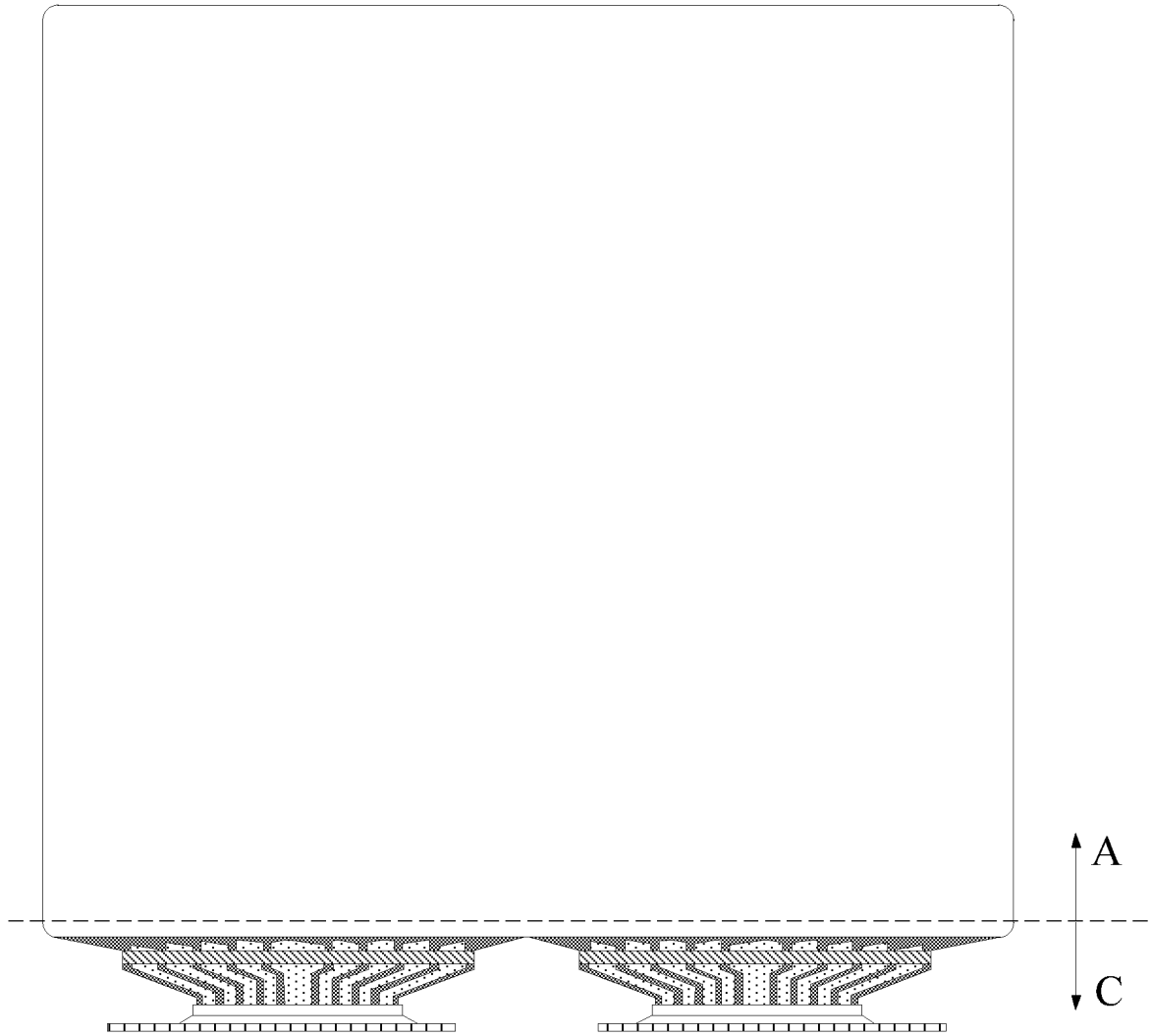
FIG. 1 is a schematic diagram of a plane structure of a display panel provided in an embodiment of the present disclosure.

Aiming at the problem that the number of signal lines at an edge of an organic light-emitting diode (OLED) display panel does not match the number of connection terminals in a binding area, an embodiment of the present disclosure provides a display panel and a display apparatus.

Specific implementations of the display panel and the display apparatus provided in embodiments of the present disclosure are described in detail below in combination with the drawings. A thicknesses and a shape of each of film layers in the drawings do not reflect true proportions, and are merely illustrative of contents of the present disclosure.

Figure 2:
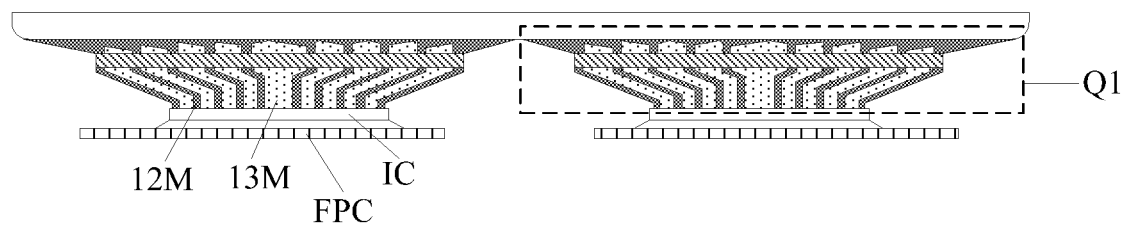
FIG. 2 is an enlarged schematic diagram of a peripheral area C in FIG. 1.
Figure 3:
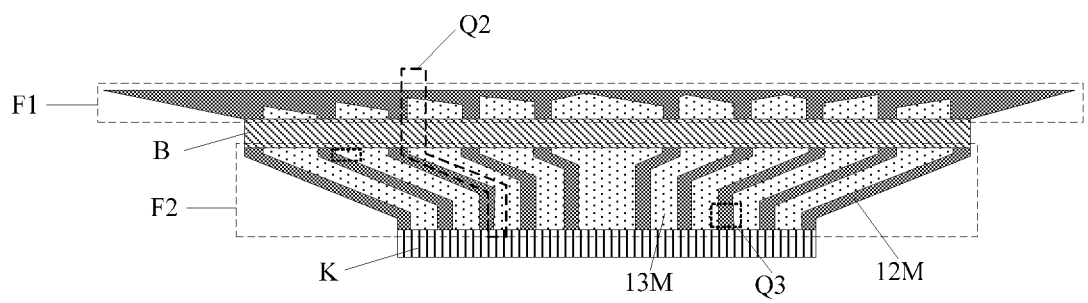
FIG. 3 is an enlarged schematic diagram of a dashed box Q1 in FIG. 2.

FIG. 1 is a schematic diagram of a plane structure of a display panel provided in an embodiment of the present disclosure. As shown in FIG. 1, the display panel provided in an embodiment of the present disclosure may include: a display area A and a peripheral area C located on at least one side of the display area A. FIG. 2 is an enlarged schematic diagram of a peripheral area C in FIG. 1, and FIG. 3 is an enlarged schematic diagram of a dashed box Q1 in FIG. 2. In combination with FIGS. 1-3, the above peripheral area C may include: a first fan-out area F1, a second fan-out area F2 located on one side of the first fan-out area F1 away from the display area A, and a bending area B located between the first fan-out area F1 and the second fan-out area F2.

Figure 4:
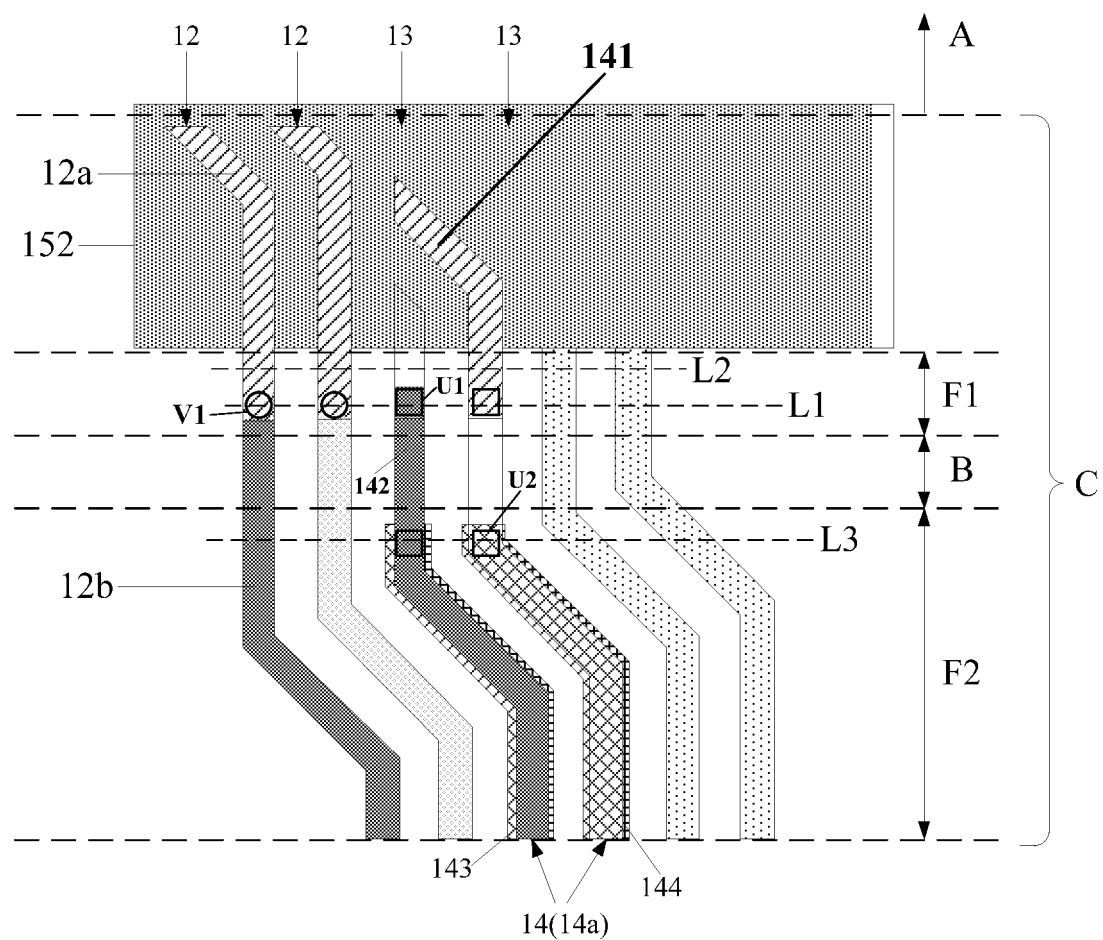
FIG. 4 is an enlarged schematic diagram of a dashed box Q2 in FIG. 3.
Figure 5:
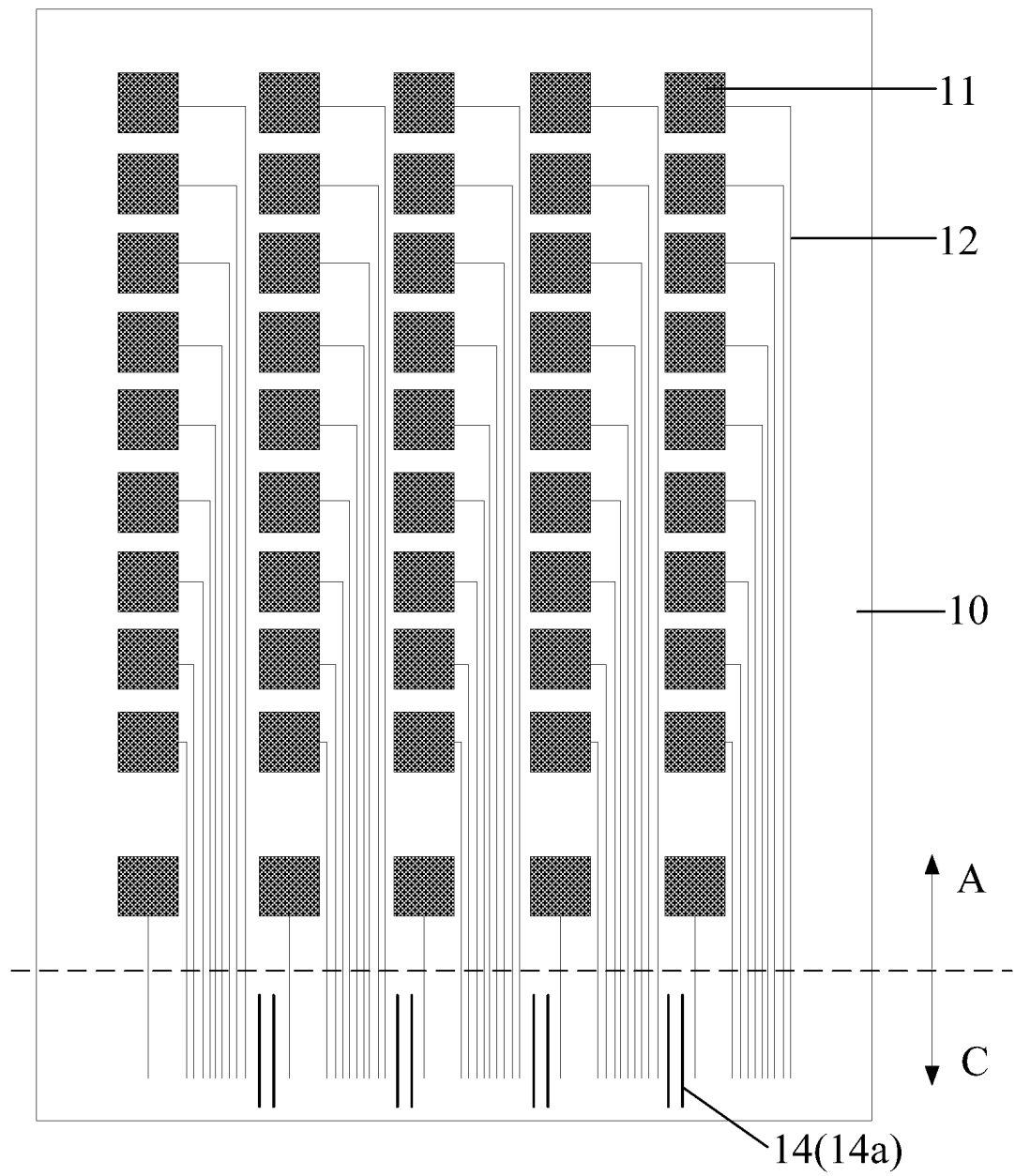
FIG. 5 is a schematic diagram of another plane structure of a display panel provided in an embodiment of the present disclosure.

FIG. 4 is an enlarged schematic diagram of a dashed box Q2 in FIG. 3, and FIG. 5 is a schematic diagram of another plane structure of a display panel provided in an embodiment of the present disclosure. In combination with FIGS. 3-5, the display panel provided in an embodiment of the present disclosure may further include:

a substrate 10;

a plurality of touch electrodes 11 at least partially located on the substrate 10 in a display area A, where during specific implementation, most of the touch electrodes 11 in the display panel are located inside the display area A; in order to ensure a touch effect at an edge of the display area A, some touch electrodes 11 extending beyond the edge of the display area A possibly exist at the edge; and certainly, in some display panels having low requirements for the touch effect, each of touch electrodes 11 may be located inside the display area A, which is not limited herein;

a plurality of touch leads 12 located on the substrate 10, one end of each touch lead 12 being coupled to the touch electrodes 11, the other end of each touch lead being located in the peripheral area C, the plurality of touch leads 12 in the display panel being divided into a plurality of touch lead groups 12M, and each of the touch lead groups 12M including the plurality of touch leads 12;

a plurality of data leads 13 located on the substrate 10 of the peripheral area C, the plurality of data leads 13 in the display panel being divided into a plurality of data lead groups 13M, each of the data lead groups 13M including the plurality of data leads 13, and at least some of touch lead groups 12M and data lead groups 13M in the display panel being alternately distributed; and a plurality of shield lines 14 located on the substrate 10 of the peripheral area C, orthographic projections of the shield lines 14 on the substrate 10 being located between orthographic projections of the touch leads 12 on the substrate 10 and orthographic projections of the data leads 13 on the substrate 10, and at least two of shield lines 14 in the display panel being connected to each other in a shorted manner.

In the display panel provided in the embodiment of the present disclosure, the plurality of shield lines are arranged, and the orthographic projections of the shield lines on the substrate are located between the orthographic projections of the touch leads on the substrate and the orthographic projections of the data leads on the substrate, such that an electric field generated by the touch leads may be shielded, and coupling capacitance is prevented from being formed between the touch leads and the data leads, thereby relieving mutual interference between touch signals and data signals, and further improving a display effect and a touch effect of the display panel.

In some embodiments, the above display panel may further include: a plurality of connection terminals located on the substrate in the above peripheral area, where the touch leads, the data leads and the shield lines are electrically connected to different connection terminals respectively. As shown in FIGS. 2 and 3, a binding area K may be arranged on one side of the second fan-out area F2 away from the first fan-out area F1, and the plurality of connection terminals are arranged in the binding area K. Signal lines of the touch leads, the data leads, the shield lines, etc. are connected to an edge of the display panel and are coupled to the corresponding connection terminals in the binding area K. Integrated drive chips IC are bound to the connection terminals in the binding area K, such that the signal lines of the touch leads, the data leads, the shield lines, etc. are coupled to the integrated drive chips IC. Alternatively, flexible printed circuit boards (FPC) may be bound to the connection terminals in the binding area K, and the integrated drive chips IC are coupled to the signal lines of the touch leads, the data leads and the shield lines by means of the FPCs, which is not limited herein.

However, due to limitation of factors of sizes of the integrated drive chips IC and a space of the display panel, an area of the binding area K is small, the number of the connection terminals in the binding area K is small, and the number of the signal lines of the touch leads, the data leads and the shield lines in the display panel is large, such that it is difficult to match the number of the signal lines at the edge of the display panel and the number of the connection terminals in the binding area K. In an embodiment of the present disclosure, the at least two shield lines in the display panel are connected to each other in a shorted manner, such that the number of the connection terminals needing to be connected to the shield lines in the display panel may be reduced, the number of the signal lines at the edge of the display panel easily matches the number of the connection terminals in the binding area K, and further the display panel is easier to wire.

Optionally, the at least two shield lines that are connected to each other in a shorted manner are electrically connected to the same connection terminal, such that the number of the connection terminals needing to be connected to the shield lines in the display panel may be effectively reduced. In some embodiments, in order to improve a shield effect of the shield lines, shield signals are applied to the shield lines, for example, touch signals or fixed potential signals may be applied to the shield lines, and the shield signals applied by the at least two shield lines that are connected to each other in a shorted manner are the same, such that after the at least two shielding lines that are connected with each other in a shorted manner are electrically connected to the same connection terminal, a shield effect of the shield lines may not be affected.

In practical application, the shield lines may be arranged to be located on the same film layer as the touch leads, or, the shield lines may be arranged to be located on the same film layer as the data leads, or, the shield lines are located on film layers between the touch leads and the data leads. The electric field generated by the touch leads is radial, such that the electric field generated by the touch leads may be effectively shielded by means of arrangement of the shield lines, thereby relieving mutual interference between the touch signals and the data signals.

With the touch electrodes 11 as self-capacitance electrodes as an example illustrated in FIG. 5, the touch electrodes 11 may be mutual capacitance electrodes during specific implementation, which is not limited herein. As shown in FIG. 5, at least some of the touch electrodes 11 in the display panel are distributed in the display area A, and the touch signals are transmitted by arranging the touch leads 12.

As shown in FIGS. 1-3, one ends of the touch leads are coupled to the touch electrodes in the display area, and the other ends of the touch leads pass through the first fan-out area F1, the bending area B and the second fan-out area F2, and then are coupled to the integrated drive chips IC. The integrated drive chips IC may be touch display driver integration (TDDI) chips. With the touch leads being coupled to the integrated drive chips IC as an example illustrated in FIG. 2, the touch leads may also be coupled to the drive chips by means of the FPCs during specific implementation, and a connection manner of the touch leads are not limited herein.

With reference to FIGS. 1-3, the display area A of the display panel is provided with a plurality of sub-pixels arranged in an array manner, and a plurality of data lines are arranged in the display area A, and the data lines are typically coupled to one column of sub-pixels. Extension directions of the data lines and the touch leads are consistent. The data lines are coupled to the data leads, and the data leads pass through the first fan-out area F1, the bending area B and the second fan-out area F2 and then are coupled to the integrated drive chips IC. In the first fan-out area F1, the bending area B and the second fan-out area F2, the touch leads and the data leads are distributed in groups, that is, the plurality of touch leads in the display panel are divided into a plurality of touch lead groups 12M, and the plurality of data leads in the display panel are divided into the plurality of data lead groups 13M, such that the touch signals and the data signals may be led out conveniently.

In a partial area of the peripheral area C close to the display area A, due to limitation of a wiring space, in a direction perpendicular to the substrate 10, some of the touch lead groups 12M and data lead groups 13M may overlap, and therefore, in the embodiment of the present disclosure, at least some of the touch lead groups 12M and data lead groups 13M in the display panel are alternately distributed. Certainly, under the condition that the wiring space is large enough, the touch lead groups 12M and the data lead groups 13M in the display panel may be alternately distributed, which is not limited herein.

In the display panel provided in embodiments of the present disclosure, the shield lines are located in gaps between the touch lead groups 12M and the data lead groups 13M. The plurality of touch leads and the plurality of data leads in the display panel are distributed in groups, such that the shield lines are arranged in the gaps between the touch lead groups 12M and the data lead groups 13M, and coupling capacitance between the touch leads and the data leads may be effectively shielded, such that mutual interference between the touch signals and the data signals is small.

Figure 6A:
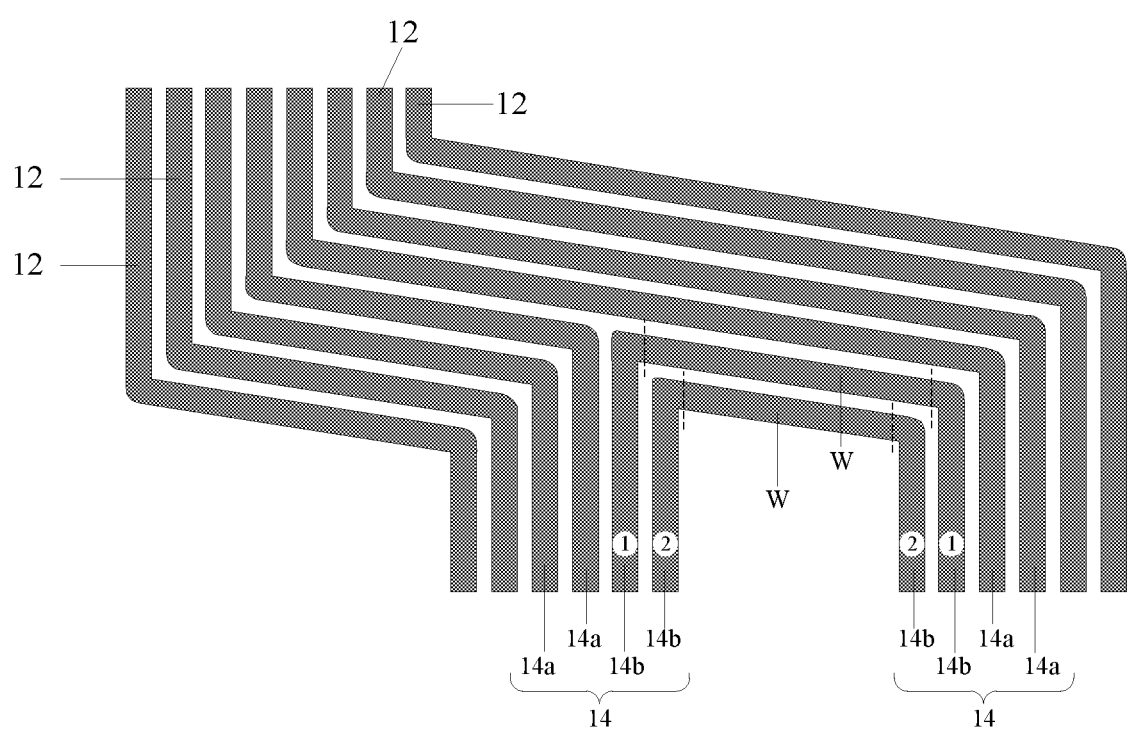
FIG. 6A is a locally enlarged schematic diagram of a second fan-out area in FIG. 4.

FIG. 6A is a locally enlarged schematic diagram of the second fan-out area in FIG. 4. As shown in FIG. 6A, the shield lines 14 that are connected to each other in a shorted manner are connected in a shorted manner by means of connection lines W. In some embodiments of the present disclosure, the connection lines W and the shield lines 14 are located on the same film layer, and the connection lines W do not cross remaining shield lines except the shield lines 14 connected to the connection lines W in a shorted manner. In this way, the at least two shield lines 14 may be connected in a shorted manner by means of the connection lines W. Being not connected to other signal lines in a shorted manner, the connection lines W do not affect performance of the other signal lines. In some embodiments, positions and shapes of the connection lines W may be configured according to the wiring space in the display panel.

Figure 6B:
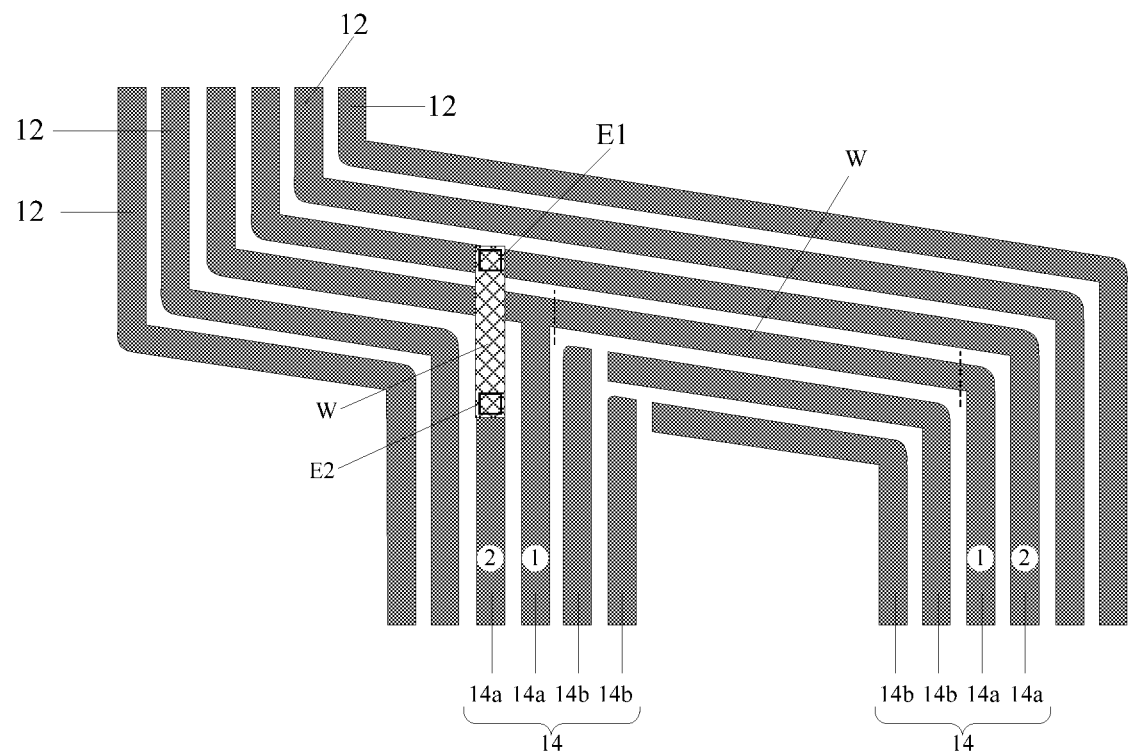
FIG. 6B is another locally enlarged schematic diagram of a second fan-out area in FIG. 4.

FIG. 6B is another locally enlarged schematic diagram of the second fan-out area in FIG. 4. As shown in FIG. 6B, the connection lines W and the shield lines 14 are located on different film layers, one end of each of the connection lines W is electrically connected to one shield line 14 by means of a first open hole E1, and the other end of the connection line W is electrically connected to the other shield line 14 by means of a second open hole E2, the first open hole E1 penetrating an insulation layer between the connection line W and the shield line 14, and the second open hole E2 penetrating an insulation layer between the connection line W and the shield line 14. In this way, the connection lines W do not occupy the wiring space of the film layers in which the shield lines 14 are located, and the signal lines in the display panel are easier to wire. In some embodiments, the connection lines W may be located on one side of the film layer in which the shield lines 14 are located close to the substrate, or the connection lines W may also be located on one side of the film layer in which the shield lines 14 are located away from the substrate, and positions of the connection lines W may be configured according to actual conditions. Moreover, the connection lines W may be configured to be located on the same film layer as other conductive film layers in the display panel in order to reduce manufacturing flow.

Figure 7:
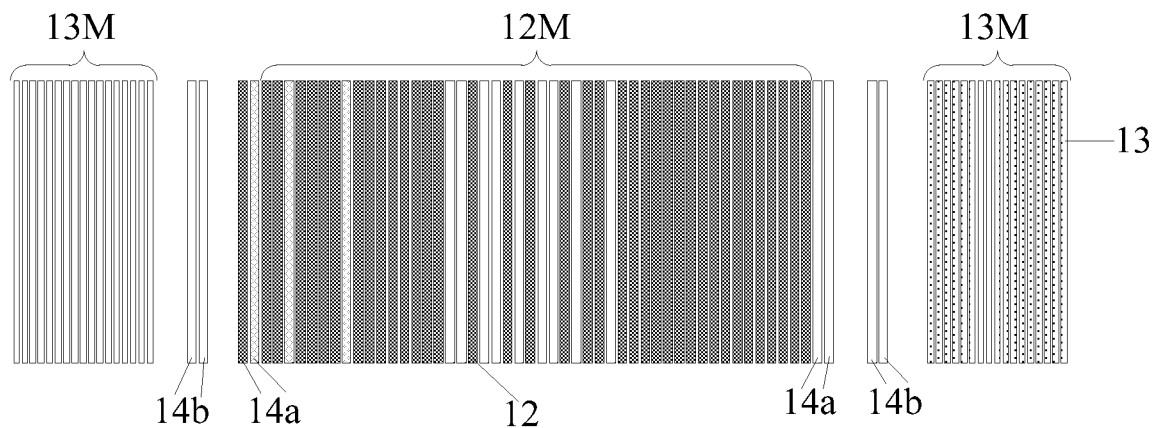
FIG. 7 is a schematic sectional diagram of a dashed box Q3 in FIG. 3.

FIG. 7 is a schematic sectional diagram of a dashed box Q3 in FIG. 3. As shown in FIGS. 3 and 7, in the embodiment of the present disclosure, the plurality of shield lines in the display panel may include a plurality of ground lines 14b, where at least one of the ground lines 14b is arranged in a gap between the touch lead group 12M and the data lead group 13M that are adjacent to each other. In a drive process, fixed potential signals, such as ground signals, may be applied to the ground lines 14b, so as to make a shield effect of the ground lines 14b better.

Moreover, with reference to FIGS. 3 and 7, the plurality of shield lines in the display panel may further include a plurality of floating touch leads 14a, where the at least one of the floating touch leads 14a is arranged in a gap between the touch lead group 12M and the data lead group 13M that are adjacent to each other, and the floating touch leads 14a are located between the ground lines 14b and the touch lead groups 12M. In an actual drive process, touch signals may be applied to the floating touch leads 14a, for example, the touch signals applied to the floating touch leads 14a may be the same as signals in the touch leads 12, and therefore, the floating touch leads 14a are arranged on two sides of each of the touch lead groups 12M, and the touch signals are conveniently applied to each of the touch leads 12 in the touch lead groups 12M and the floating touch leads 14a at the same time.

In some embodiments of the present disclosure, with two floating touch leads 14a and two ground lines 14b being arranged in the gap between the touch lead group 12M and the data lead group 13M that are adjacent to each other as an example illustrated in FIG. 7, the number of the floating touch leads 14a and the ground lines 14b is not limited herein, and during specific implementation, the number of the floating touch leads 14a and the ground lines 14b is reasonably configured according to a size of the gap between the touch lead group 12M and the data lead group 13M that are adjacent to each other.

In some embodiments, in order to ensure that the shield lines have an excellent shield effect, shield signals of the at least two shield lines that are connected to each other in a shorted manner are the same. For example, at least two shield lines that are connected to each other in a shorted manner are both floating touch leads, and alternatively, at least two shield lines that are connected to each other in a shorted manner are both ground lines, that is, the floating touch leads and the ground lines are not arranged to be connected to each other in a shorted manner. In this way, after the at least two shield lines that are connected to each other in a shorted manner are electrically connected to the same connection terminal, the shield effect of the shield lines may not be affected.

As shown in FIG. 4, in the embodiment the present disclosure, the above peripheral area may include a first fan-out area F1, a second fan-out area F2 located on one side of the first fan-out area F1 away from the display area, and a bending area B located between the first fan-out area F1 and the second fan-out area F2. The above floating touch leads 14a are located in at least one of the first fan-out area F1, the bending area B and the second fan-out area F2. For example, in FIG. 4, one ends of the floating touch leads 14a are located in the first fan-out area F1, the other ends of the floating touch leads are located in the second fan-out area F2, and the floating touch leads 14a pass through the bending area B. With reference to FIGS. 2 and 3, due to the small size of the integrated drive chips IC, in order to couple the plurality of touch leads and the plurality of data leads to positions of the integrated drive chips IC, the first fan-out area F1 and the second fan-out area F2 are each configured in a fan shape in which a width of a side edge close to the display area A is larger and a width of a side edge away from the display area A is smaller. Moreover, at least in the second fan-out area F2, an inclined line section inclined towards the integrated drive chip IC is arranged in each of the touch leads and the data leads. In the first fan-out area F1, the bending area B and the second fan-out area F2, a distance between the touch lead and the data lead that are adjacent to each other is close, and therefore, the floating touch leads are arranged in at least one of the first fan-out area F1, the bending area B and the second fan-out area F2, and coupling capacitance formed between the touch leads and the data leads may be effectively shielded, thereby greatly reducing mutual interference between the touch signals and the data signals.

With reference to FIG. 4, in the display panel provided in the embodiment of the present disclosure, the floating touch leads 14a may be located in the first fan-out area F1, the bending area B, and the second fan-out area F2, and a shape of the floating touch leads 14a may be consistent with a shape of the data leads 13 located in the first fan-out area F1, the bending area B, and the second fan-out area F2. In the first fan-out area F1, the bending area B and the second fan-out area F2, the distance between the touch lead 12 and the data lead 13 that are adjacent to each other is close, the floating touch leads 14a are arranged in the first fan-out area F1, the bending area B and the second fan-out area F2, and coupling capacitance formed between the touch leads 12 and the data leads 13 may be effectively shielded, thereby greatly reducing mutual interference between the touch signals and the data signals. Moreover, the shape of the floating touch leads 14a is configured to be consistent with the shape of the data leads 13 located in the first fan-out area F1, the bending area B and the second fan-out area F2, the wiring space between the touch leads 12 and the data leads 13 may be fully utilized, and a length of the floating touch leads 14a is long enough to ensure that the floating touch leads 14a have an excellent shield effect.

In combination with FIGS. 4 and 6A, the ground lines 14b are located in the second fan-out area F2. Compared with the first fan-out area F1 and the bending area B, a width of the second fan-out area F2 is smaller, such that a distance between the touch leads and the data leads is closer, and interference between the touch leads and the data leads is larger. Thus, the ground lines 14b are additionally arranged in the second fan-out area F2, such that mutual interference between the touch signals and the data signals may be further reduced.

In some embodiments, as shown in FIG. 6A, each of the shield lines in the gap between the touch lead group and the data lead group that are adjacent to each other is taken as a shield line group. For example, in FIG. 6A, the four shield lines 14 on a left side serve as a shield line group, the four shield lines 14 on a right side serve as a shield line group, and in two adjacent shield line groups, each of the ground lines 14b is located in a gap formed by each of the floating touch leads 14a. In this way, wiring in the display panel may be more compact, and the wiring space of the display panel is reasonably utilized. Moreover, the floating touch leads 14a in the shield line groups are closer to the touch leads 12, such that the touch signals are conveniently applied to the touch leads 12 and the floating touch leads 14a at the same time.

In some embodiments of the present disclosure, with reference to FIG. 6A, in two adjacent shield line groups, the ground lines 14b in each of the shield line groups are sorted in sequence from a closer distance to the floating touch leads 14a in the shield line group to a farther distance to same. For example, serial numbers of the four ground lines 14b in FIG. 6A may be sequentially 1, 2, 2 and 1. In two adjacent shield line groups, the i-th ground line in one shield line group is connected to the i-th ground line in the other shield line group in a shorted manner by means of the connection line located on the same film layer, i being a positive integer greater than 0 and less than or equal to the total number of the ground lines in the shield line groups, and the connection line connected to the i-th ground line being located on one side, close to the first fan-out area, of the connection line connected to the (i+1)-th ground line. For example, in FIG. 6A, the first ground line 14b in the shield line group on the left side is connected to the first ground line 14b on the shield wire group on the right side in a shorted manner by means of the connection line W located on the same film layer, the second ground line 14b in the shield line group on the left side is connected to the second ground line 14b on the shield line group on the right side in a shorted manner by means of the connection line W located on the same film layer, and the first ground wire 14b is located on one side, close to the first fan-out area, of the connection line W connected to the second ground line 14b. In this way, the ground lines may be connected in a shorted manner by means of the connection lines W located on the same film layer as the shield lines, an implementation manner is simple, and the wiring space of the display panel may be reasonably utilized.

In another possible implementation of the present disclosure, as shown in FIG. 6B, in two adjacent shield line groups, the floating touch leads 14a in the shield line groups are sorted from a closer distance to the ground lines 14b in the shield line groups to a farther distance to same. For example, serial numbers of the four floating touch leads 14a in FIG. 6A may be sequentially 2, 1, 1 and 2. In two adjacent floating line groups, the first floating touch lead 14a in one shield line group is connected to the first floating touch lead 14a in the other shield line group in a shorted manner by means of the connection line W located on the same film layer; and the j-th floating touch lead in one shield line group is connected to the j-th floating touch lead W in the other shield line group by means of the connection line W located on a different layer, j being a positive integer greater than 1 and less than or equal to the total number of the ground lines in the shield line groups. For example, in FIG. 6B, the first floating touch lead 14a in the shield line group on the left side is connected to the first floating touch lead 14a in the shield line group on the right side in a shorted manner by means of the connection line W located on the same film layer, and the second floating touch lead 14a in the shield line group on the left side is connected to the second floating touch lead 14a in the shield line group on the right side in a shorted manner by means of the connection line W located on a different layer. The floating touch leads 14a are long and the floating touch leads 14a are densely arranged, and therefore, when a manner shown in FIG. 6B is used to connect the floating touch leads 14a in a shorted manner, the wiring space of the display panel may be fully utilized.

In some embodiments, the manner shown in FIG. 6A may be combined with the manner shown in FIG. 6B, that is, the at least two floating touch leads 14a may be connected in a shorted manner, or the at least two ground lines 14b may be connected in a shorted manner. The number of the connection terminals may be configured according to the number of the connection terminals in the binding area, which is not limited herein.

In combination with FIGS. 2 and 3, in the display panel provided in embodiments of the present disclosure, the first fan-out area F1, the bending area B and the second fan-out area F2 are arranged, such that after the display panel is manufactured, the display panel may be bent at a position of the bending area B, so as to bend the second fan-out area F2 of the display panel to one side of the display panel away from a display surface, and the signal lines of the touch leads, the data leads, etc. in the second fan-out area F2 are coupled to the integrated drive chips IC on one side of the display area away from the display surface, thereby greatly reducing a frame area of the display panel.

Figure 8:
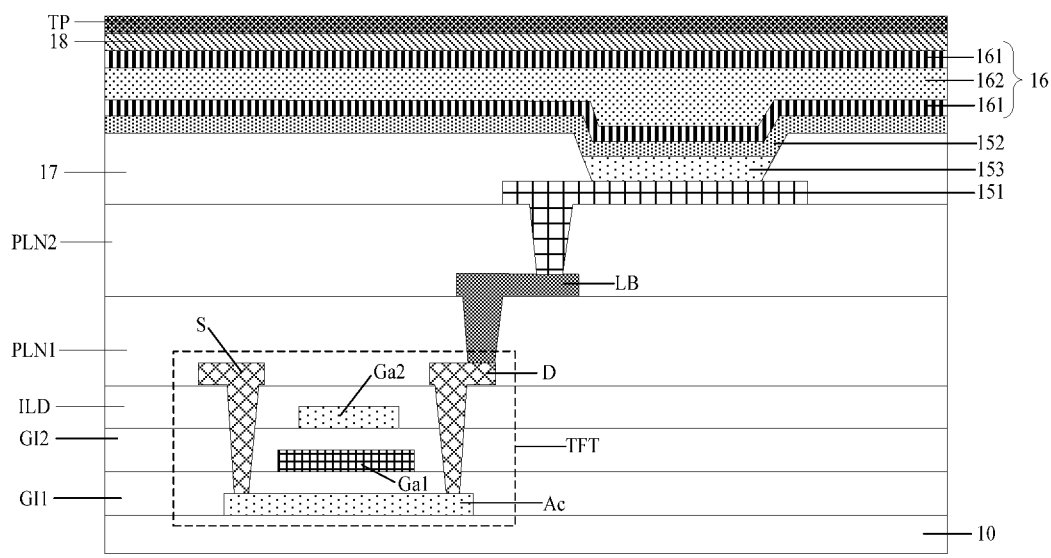
FIG. 8 is a schematic sectional diagram of a display panel provided in an embodiment of the present disclosure in a display area.

FIG. 8 is a schematic sectional diagram of a display panel provided in an embodiment of the present disclosure in a display area. As shown in FIG. 8, the display panel in the embodiment of the present disclosure may further include: a plurality of first electrodes 151, second electrodes 152 located on one sides of the first electrodes 151 away from the substrate 10, and light-emitting layers 153 located between the first electrodes 151 and the second electrodes 152, where the second electrodes 152 may be arranged in a full-surface manner. Pixel defining layers 17 may further be arranged between film layers in which the first electrode 151 are located and the light-emitting layers 153, and the pixel defining layers 17 are used for defining an area of each of sub-pixels, that is, a position in which an opening of each of the pixel defining layers 17 is located in the figure corresponds to one sub-pixel.

Moreover, in order to drive each of the sub-pixels to emit light, the display panel may further include components of a thin film transistor (TFT), a capacitor structure, etc. The TFT may include an active layer Ac, an input terminal S, an output terminal D, and a gate Ga1, the output terminal D of the TFT being coupled to a first electrode 151 by means of a conductive connector LB, and the gate Ga1 and a third electrode Ga2 constituting the capacitor structure. In order to insulate conductive components of different film layers from each other, the display panel may further include a first gate insulation layer GI1 located between the active layer Ac and the gate Ga1, a second gate insulation layer GI2 located between the gate Ga1 and the third electrode Ga2, an interlayer insulation layer ILD located between the third electrode Ga2 and the input terminal S, a first planarization layer PLN1 located between the input terminal S and the conductive connector LB, and a second planarization layer PLN2 located between the conductive connector LB and the first electrode 151. Moreover, a passivation layer (not shown in the figure) may be further arranged between the input terminal S and the first planarization layer PLN1. Certainly, no passivation layer may be arranged, which is not limited herein.

In combination with FIGS. 4-8, in some embodiment of the present disclosure, orthographic projections of the floating touch leads 14a on the substrate 10 and orthographic projections of the second electrodes 152 on the substrate 10 have an overlap area. It may be seen from FIG. 4 that a certain space still exists between the touch leads 12 and the data leads 13 at an edge of an area, close to the first fan-out area F1, covered with second electrodes 152, and therefore, the floating touch leads 14a extend to the area covered with the second electrodes 152, and the shield effect of the floating touch leads 14a may be further improved. Moreover, as shown in FIG. 5, the orthographic projections of the floating touch leads 14a on the substrate 10 do not overlap orthographic projections of the touch electrodes 11 on the substrate 10, such that the situation that the floating touch leads 14a are connected to the touch electrodes 11 in a shorted manner, thereby affecting a touch effect of the touch electrodes 11 may be avoided.

In some embodiments, the display panel provided in embodiments of the present disclosure, as shown in FIG. 8, may further include: packaging layers 16 located on one sides of the second electrodes 152 away from the substrate 10, touch electrode layers TP located on one sides of the packaging layers 16 away from the substrate 10, and touch barrier layers 18 located between the packaging layers 16 and the touch electrode layers TP. Each of the packaging layers 16 may include: an organic film layer 162 and inorganic film layers 161 that are laminated, where the inorganic film layers 161 may have an effect of blocking water vapor and oxygen, and the organic film layer 162 may be located between two adjacent inorganic film layers 161 and may have effects of stress release and planarization. The touch electrodes in the embodiment of the present disclosure are located in the touch electrode layers TP.

Figure 9:
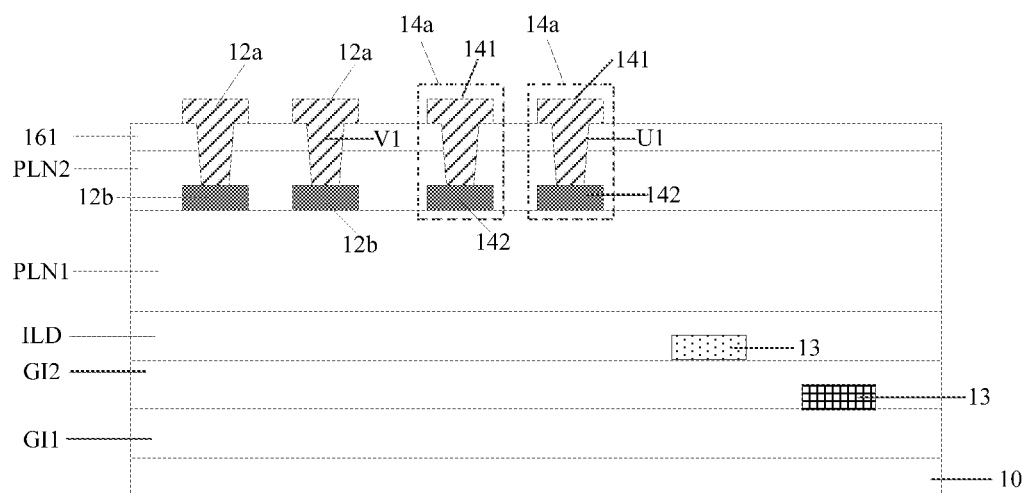
FIG. 9 is a schematic sectional diagram of a dashed line L1 in FIG. 4.

FIG. 9 is schematic sectional diagram of a dashed line L1 in FIG. 4. In combination with FIGS. 4, 8, and 9, each of the floating touch leads 14 may include: a first shield sub-line 141 and second shield sub-lines 142, where the first shield sub-line 141 is located on one side of the packaging layer 16 away from the substrate 10;

the second shield sub-line 142 is located on one side of the first electrode 151 away from the substrate 10;

an orthographic projection of a first end of the first shield sub-line 141 on the substrate 10 is located in a range of an orthographic projection of the second electrode 152 on the substrate, and a second end of the first shield sub-line 141 is located in the first fan-out area F1; the second shield sub-line 142 is located in the first fan-out area F1, the bending area B and the second fan-out area F2; and the second end of the first shield sub-line 141 is coupled to the second shield sub-line 142 by means of a first via hole U1, and the first via hole U1 penetrates an insulation layer between the first shield sub-line 141 and the second shield sub-line 142.

Since the second electrodes 152 are generally arranged in a full-surface manner, in order to prevent the touch signals from being shielded by the second electrodes 152, the touch electrode layers TP are generally arranged on one sides of the packaging layers 16 facing away from the substrate 10, and therefore, in order to effectively relieve mutual interference between the touch leads 12 and the data leads 13, the first shield sub-lines 141 are arranged on one sides of the packaging layers 16 facing away from the substrate 10. Moreover, in order to prevent the floating touch leads 14a from being broken at the bending area B when the display panel is bent at the bending area B, in the embodiment of the present disclosure, the floating touch leads 14a are arranged to be the first shield sub-lines 141 and the second shield sub-lines 142, the second shield sub-lines 142 are located on one sides of the first electrodes 151 close to the substrate 10, and the second ends of the first shield sub-lines 141 are coupled to the second shield sub-lines 142 by means of the first via holes U1 located in the first fan-out area F1, such that the first shield sub-lines 141 are changed to the second shield sub-lines 142 in the first fan-out area F1, the floating touch leads 14a are subjected to small stress when being bent in the bending area B, and therefore, the floating touch leads 14a are not prone to breakage at the bending area B.

In some embodiments, in the display panel provided, in combination with FIGS. 4, 8, and 9, each of the touch leads 12 may include: a first lead portion 12a and a second lead portion 12b, where the first lead portion 12a is located on one side of the packaging layer 16 away from the substrate 10, that is, the first lead portion 12a is located in the touch electrode layer TP, and moreover, the touch electrode is further arranged in the touch electrode layer TP;

the second lead portion 12b is located on one side of the first electrode 151 close to the substrate 10;

a first end of the first lead portion 12a is coupled to the touch electrode, and a second end of the first lead part is located in the first fan-out area F1; the second lead portion 12b is located in the first fan-out area F1, the bending area B and the second fan-out area F2;

a second end of the first lead portion 12a is coupled to the second lead portion 12b by means of a first through hole V1, and the first through hole V1 penetrates an insulation layer between the first lead portion 12a and the second lead portion 12b; and the second shield sub-line 142 is located on the same film layer as the second lead portion 12b.

The second electrodes 152 arranged in a full-surface manner are generally arranged in the display area of the display panel, and in order to prevent the touch signals from being shielded by the second electrodes 152, the touch electrode layers TP are generally arranged on one sides of the packaging layers 16 away from the substrate 10. In order to prevent the touch leads 12 from being broken at the bending area B when the display panel is bent at the bending area B, in the embodiment of the present disclosure, the touch leads 12 are arranged to include the first lead portion 12a and the second lead portion 12b, one ends of the first lead portions 12a are coupled to the touch electrodes in the touch electrode layers TP, the other ends of the first lead portions extend into the first fan-out area F1, and are coupled to the second lead portions 12b by means of the first through holes V1, so as to change the touch leads 12 to the second lead portions 12b in the first fan-out area F1, stress borne by the touch leads 12 when being bent in the bending area B is small, and therefore, the touch leads 12 are not prone to breakage in the bending area B.

Moreover, the second shield sub-lines 142 and the second lead portions 12b are located on the same film layer. In a manufacturing process, the second shield sub-wires 142 and the second lead portions 12b may be manufactured by using the same composition process, thereby reducing manufacturing cost. Moreover, the second lead portions 12b and the conductive connectors LB in the display area may be located on the same film layer, such that the conductive connectors LB, the second shield sub-lines 142 and the second lead portions 12b may be manufactured by using the same composition process, thereby further reducing manufacturing cost. In some embodiments, the ground lines may also be arranged to be located on the same film layer as the second shield sub-lines 142, such that in an actual manufacturing process, the conductive connectors LB, the second shield sub-lines 142, the second lead portions 12b and the ground lines are manufactured by using the same composition process, thereby further reducing the manufacturing cost.

Figure 10:
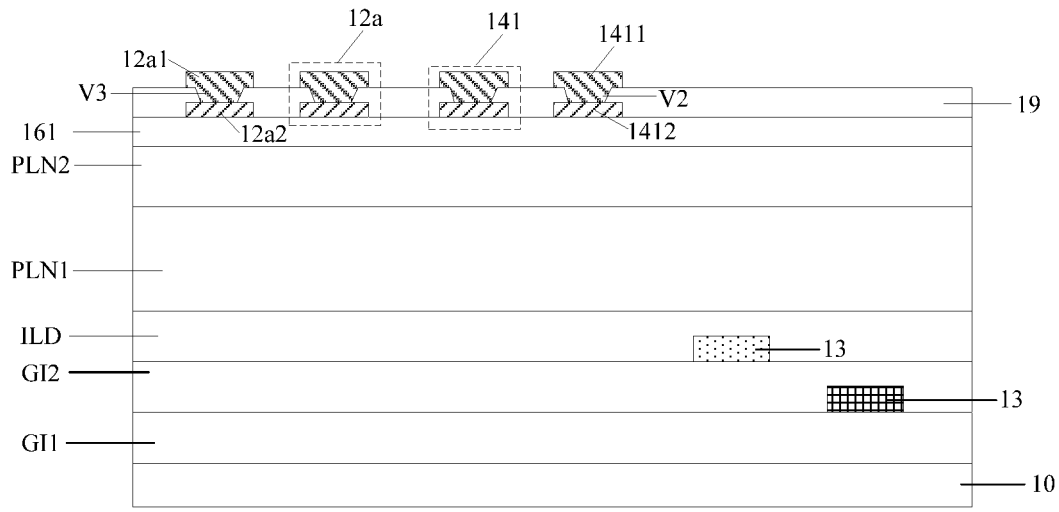
FIG. 10 is a schematic sectional diagram of a dashed line L2 in FIG. 4.

FIG. 10 is a schematic sectional diagram of a dashed line L2 in FIG. 4. As shown in FIG. 10, each of the first shield sub-lines 141 includes: a first wire 1411 and a second wire 1412 located on one side of the first wire 1411 close to the substrate 10, where the first wire 1411 is coupled to the second wire 1412 by means of a second through hole V2, and the second through hole V2 penetrates an insulation layer 19 between the first wire 1411 and the second wire 1412; and each of the first lead portions 12a includes a first lead 12a1 and a second lead 12a2 located on one side of the first lead 12a1 close to the substrate 10, where the first lead 12a1 is coupled to the second lead 12a2 by means of a third through hole V3, and the third through hole V3 penetrates an insulation layer 19 between the first lead 12a1 and the second lead 12a2; and the first wire 1411 and the first lead 12a1 are located on the same film layer, and the second wire and the second lead are located on the same film layer.

In some embodiments, each of the touch electrodes in each of the touch electrode layers may include: a first touch sub-electrode and a second touch sub-electrode that are laminated, where the first touch sub-electrode is coupled to the second touch sub-electrode by means of a through hole. In a manufacturing process, the first touch sub-electrode, the first wire and the first lead may be manufactured by using the same composition process, and the second touch sub-electrode, the second wire and the second lead are manufactured by using the same composition process, thereby reducing the manufacturing cost.

Figure 11:
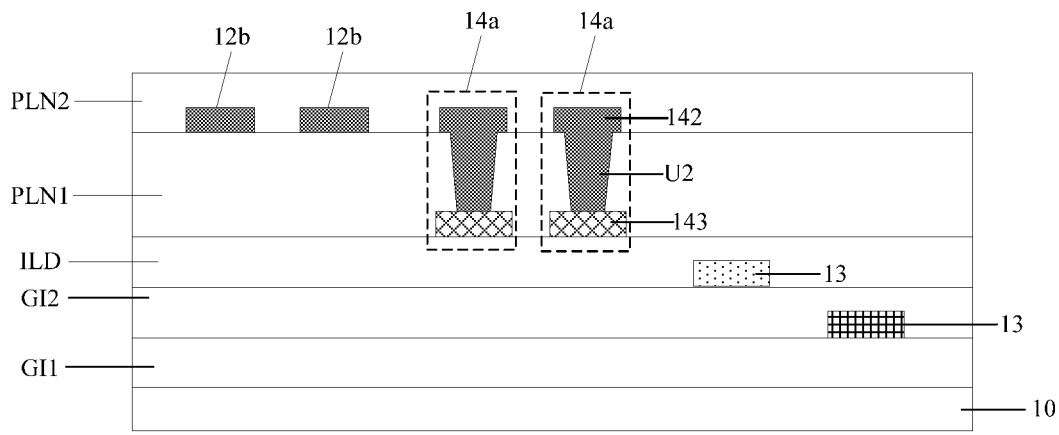
FIG. 11 is a schematic sectional diagram of a dashed line L3 in FIG. 4.

Optionally, in the display panel provided in embodiments of the present disclosure, FIG. 11 is a schematic sectional diagram of a dashed line L3 in FIG. 4. As shown in FIGS. 4 and 11, each of the floating touch leads 14a may further include: a third shield sub-line 143 located in the second fan-out area F2, where
- the third shield sub-line 143 is located on one side of the second shield sub-line 142 close to the substrate 10; and
- the second shield sub-line 142 is coupled to the third shield sub-line 143 by means of a second via hole U2; the second via hole U2 penetrates an insulation layer between the second shield sub-line 142 and the third shield sub-line 143; and the second via hole U2 is located in the second fan-out area F2.

Since the electric field generated by the touch leads is radial, double-layer wires arranged in a laminated manner are used as the floating touch leads 14a, and the second shield sub-lines 142 and the third shield sub-lines 143 have an effect of shielding at the same time, such that shield performance of the floating touch leads 14a may be improved, and a shield range of the floating touch leads 14a may be broader, thereby further reducing mutual interference between the touch signals and the data signals. Moreover, the second shield sub-lines 142 are coupled to the third shield sub-lines 143 by means of the second via holes U2, such that a better shield effect may be achieved compared with two shield sub-lines separately arranged. In addition, the second via holes U2 are provided in an area outside the bending area B, such that the display panel may be prevented from breaking and other defects when being bent in the bending area B.

Figure 12:
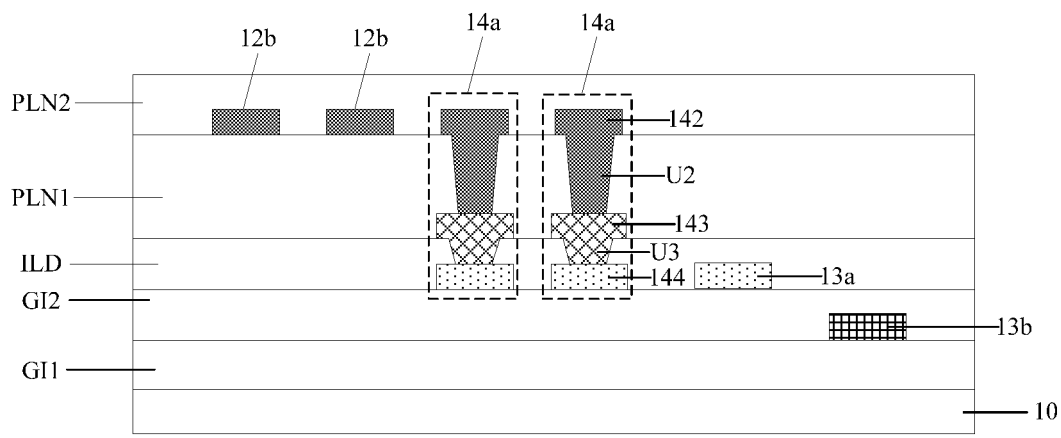
FIG. 12 is another schematic sectional diagram of a dashed line L3 in FIG. 4.

FIG. 12 is another schematic sectional diagram of a dashed line L3 in FIG. 4. As shown in FIGS. 4 and 12, in the display panel provided in the embodiment of the present disclosure, each of the floating touch leads 14a may further include: a fourth shield sub-line 144 located in the second fan-out area F2, where
- the fourth shield sub-line 144 is located on one side of the third shield sub-line 143 close to the substrate 10; and
- the third shield sub-line 143 is coupled to the fourth shield sub-line 144 by means of a third via hole U3; and the third via hole U3 penetrates an insulation layer between the third shield sub-line 143 and the fourth shield sub-line 144.

Since the electric field generated by the touch leads is radial, the fourth shield sub-line 144 is arranged on one side of the third shield sub-line 143 close to the substrate 10, and the fourth shield sub-line 144 is coupled to the third shield sub-line 143 by means of a third via hole U3, such that the second shield sub-line 142, the third shield sub-line 143 and the fourth shield sub-line 144 have an effect of shielding at the same time, and shield performance of the floating touch leads 14a is further improved, thereby further reducing mutual interference between the touch signals and the data signals.

It should be noted that with the second shield sub-line 142 being coupled to the third shield sub-line 143 by means of one second via hole U2 as an example illustrated in the drawings of the embodiment of the present disclosure, during specific implementation, in order to enhance conduction performance of the second shield sub-lines 142 and the third shield sub-lines 143, the second shield sub-lines 142 are coupled to the third shield sub-lines 143 by means of more second via holes U2. By the same reasoning, the third shield sub-lines 143 may be coupled to the fourth shield sub-lines 144 by means of more third via holes U3.

Optionally, in the display panel provided in the embodiment of the present disclosure, as shown in FIG. 12, in the peripheral area, the plurality of data leads in the display panel may be divided into: a plurality of first data leads 13a located on a first metal layer, and a plurality of second data leads 13b located on a second metal layer; the second metal layer is located on one side of the first metal layer close to the substrate; and
- orthographic projections of the first data leads 13a on the substrate 10 and orthographic projections of the second data leads 13b on the substrate 10 are alternately distributed.

In some embodiments of the present disclosure, the plurality of data leads located in the peripheral area are divided into the plurality of first data leads 13a and the plurality of second data leads 13b, the first data leads 13a and the second data leads 13b are located on different metal layers, and the first data leads 13a and the second data leads 13b are alternately distributed, such that the adjacent data leads are located on different metal layers, mutual interference between the adjacent data leads may be avoided, a display effect of the display panel is improved, an overall width of wiring may be reduced, and narrow frame design is facilitated. In combination with FIGS. 8 and 12, the first metal layer may be a film layer in which the third electrodes Ga2 are located, that is, the first data leads 13a may be located on the same film layer as the third electrodes Ga2, and the second metal layer may be a film layer in which the gates Ga1 is located, that is, the second data leads 13b may be located on the same film layer as the gates Ga1. In the manufacturing process, the first data leads 13a and the third electrodes Ga2 may be manufactured by using the same composition process, and the second data leads 13b and the gates Ga1 may be manufactured by using the same composition process, thereby reducing the manufacturing cost.

In addition, the data leads are coupled to the data lines in the display area, the data lines in the display area and the input terminal S of the TFT may be located on the same film layer. In the manufacturing process, the input terminal S, the output terminal D and the data lines of the TFT may be manufactured by using the same composition process, thereby reducing the manufacturing cost.

Figure 13:
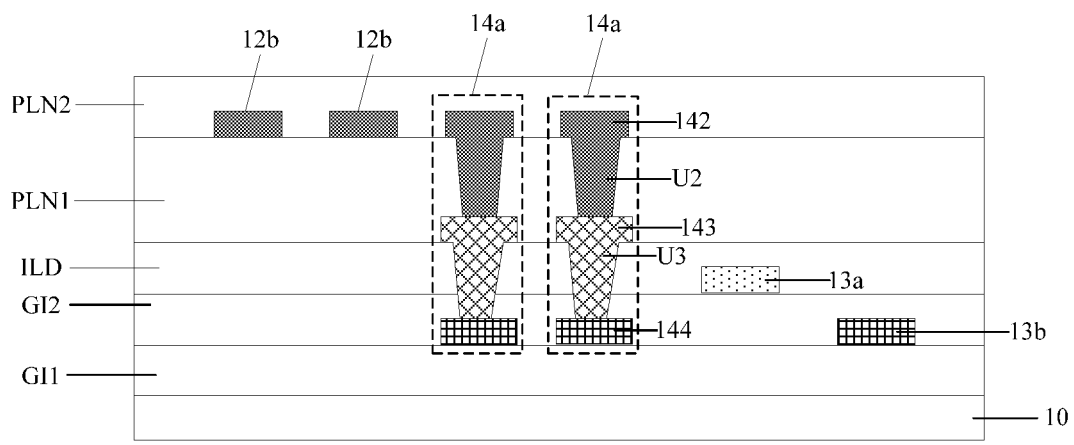
FIG. 13 is another schematic sectional diagram of a dashed line L3 in FIG. 4.
Figure 14:
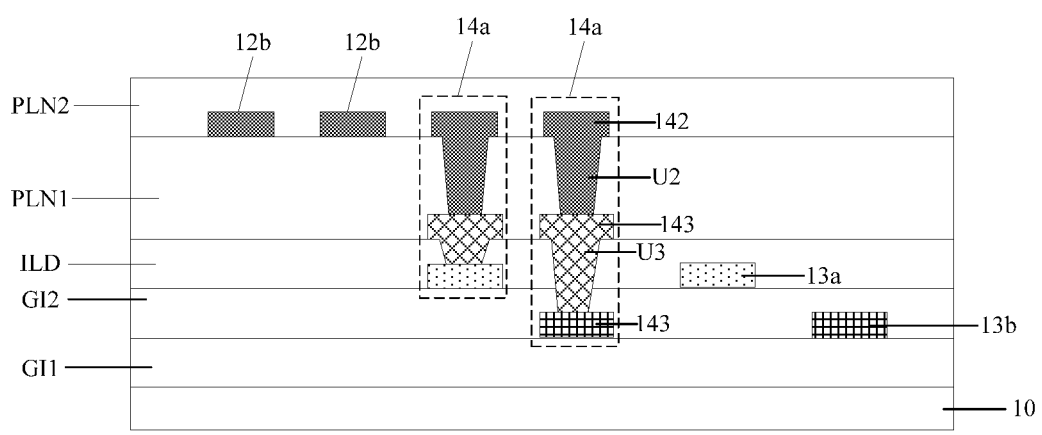
FIG. 14 is another schematic sectional diagram of a dashed line L3 in FIG. 4.

In some embodiments, in the display panel provided, as shown in FIG. 12, the fourth sub-shield lines 144 may be arranged on the same layer as the first data leads 13a; or,
- as shown in FIG. 13 that is another schematic sectional diagram of a dashed line L3 in FIG. 4, the fourth shield sub-lines 144 may be arranged on the same layer as the second data leads 13b; or,
- as shown in FIG. 14 that is another schematic sectional diagram of a dashed line L3 in FIG. 4, the fourth shield sub-lines 144 are arranged on the same layer as the first data leads 13a; and, the fourth shield sub-lines 144 are arranged on the same layer as the second data leads 13b, that is, some fourth shield sub-lines 144 of the plurality of fourth shield sub-lines 144 are arranged on the same layer as the first data leads 13a, and another portion of the fourth shield sub-lines 144 are arranged on the same layer as the second data leads 13b.

In conclusion, the fourth shield sub-lines 144 are arranged in the three manners, and the fourth shield sub-lines 144 and the first data leads 13a or the second data leads 13b may be manufactured by using the same composition process, thereby reducing the manufacturing cost.

Figure 15:
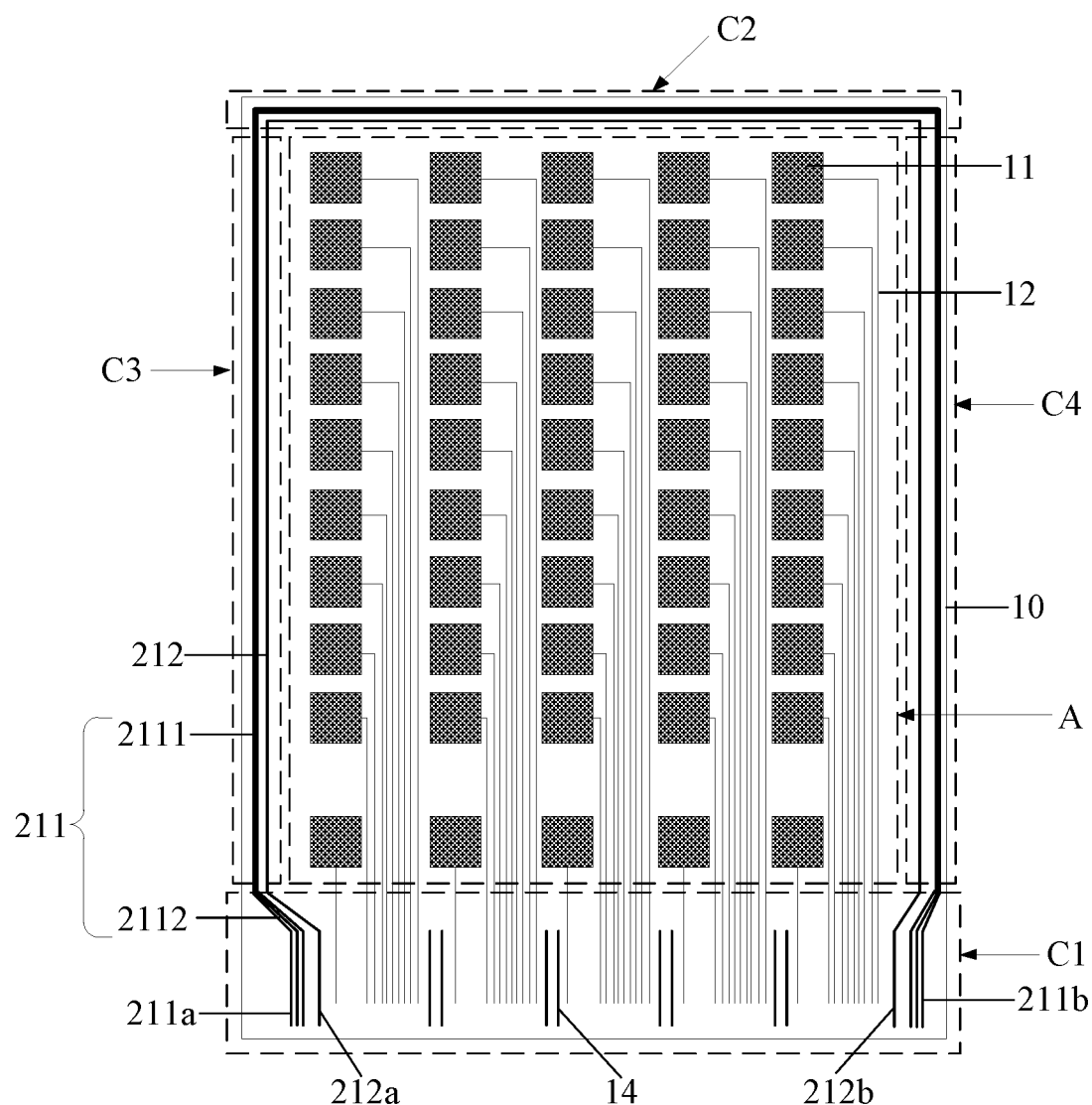
FIG. 15 is a schematic diagram of another plane structure of a display panel provided in an embodiment of the present disclosure.

FIG. 15 is a schematic diagram of another plane structure of a display panel provided in an embodiment of the present disclosure. As shown in FIG. 15, the display panel provided in the embodiment of the present disclosure may further include: touch shield lines (shown as 211 or 212 in FIG. 15) located on the substrate 10.

The peripheral area includes a first peripheral area C1 and a second peripheral area C2 that are oppositely arranged, and a third peripheral area C3 and a fourth peripheral area C4 that are oppositely arranged, where the shield lines 14 are located in the first peripheral area C1.

The first end 211a (or 212a) and the second end 211b (or 212b) of the touch shield line 211 (or 212) are located in the first peripheral area C1, the touch shield line 211 (or 212) passes through the second peripheral area C2, the third peripheral area C3 and the fourth peripheral area C4, and the touch shield line 211 (or 212) surrounds each of the touch electrodes 11 in the display panel.

In this way, the touch shield lines 211 (or 212) surrounding the touch electrodes 11 in the display panel are arranged, such that an influence of external interference on the touch electrodes 11 may be shielded, and the touch effect of the display panel is improved.

In some embodiments, in the display panel, with reference to FIG. 15, each of the touch shield lines in the display panel includes: a first touch shield line 211 and a second touch shield line 212, where the second touch shield line 212 is located on one side of the first touch shield line 211 close to the touch electrode 11. In the embodiment of the present disclosure, the two touch shield lines are arranged, i.e., the first touch shield line 211 and the second touch shield line 212, in practical application, different signals may be applied to the first touch shield line 211 and the second touch shield line 212, thereby improving the shield effect, and further shielding the influence of external interference on the touch electrode 11.

Optionally, in the display panel, as shown in FIG. 15, each of the first touch shield line 211 may include: a first touch shield sub-line 2111, and at least two second touch shield sub-lines 2112, where the first touch shield sub-line 2111 is located in the second peripheral area C2, the third peripheral area C3 and the fourth peripheral area C4; and the second touch shield sub-line 2112 is coupled to the first touch shield sub-line 2111, and the second touch shield sub-line 2112 is located in the first peripheral area C1.

That is, the first touch shield line 211 is a signal line (i.e., first touch shield sub-line 2111) in the second peripheral area C2, the third peripheral area C3 and the fourth peripheral area C4, and the first touch shield line 211 extends to the first peripheral area C1 and then is divided into at least two signal lines (i.e, second touch shield sub-lines 2112). With the first touch shield line 211 including three second touch shield sub-lines 2112 as an example illustrated in FIG. 15, the first touch shield line may be configured according to actual needs during specific implementation.

In this way, each of the first touch shield lines 211 has at least two first ends 211a and at least two second ends 211b, thereby facilitating coupling with pins of other components. In the drive process, a fixed signal, such as a ground signal, may be applied to the first touch shield line 211, and a touch signal may be applied to the second touch shield line 212, such that a better shield effect may be achieved.

In practical application, in the display panel provided in embodiments of the present disclosure, as shown in FIG. 15, in the second peripheral area C2, the third peripheral area C3 and the fourth peripheral area C4, a line width of the first touch shield lines 211 is greater than that of the second touch shield lines 212. That is, the line width of the touch shield lines away from the touch electrodes 11 is large, such that the shield effect of the touch shield lines on external interference may be better, and the touch effect of the display panel is better.

On the basis of the same inventive concept, an embodiment of the present disclosure further provides a display apparatus. The display apparatus includes the display panel of any one above. The display apparatus may be applied to any product or component having a display function such as a mobile phone, a tablet computer, a television, a displayer, a notebook computer, a digital photo frame and a navigator. The principle of the display apparatus to solve the problem is similar to that of the above display panel, and therefore, implementation of the display apparatus may refer to implementation of the above display panel, which is not repeated herein.

The display apparatus provided in embodiments of the present disclosure may further include an integrated drive chip, where each of touch leads, each of data leads and each of shield lines in the display panel are coupled to the integrated drive chip, and the at least two shield lines in the display panel are connected to each other in a shorted manner; and the display panel is bent in a bending area, and a second fan-out area and the integrated drive chip of the display panel are located on one side of the display panel away from a display surface.

In some embodiments, after the display panel is manufactured, the display panel may be bent at a position of the bending area, so as to bend the second fan-out area of the display panel to one side of the display panel away from the display surface, and signal lines of touch leads, data leads, etc. in the second fan-out area are coupled to the integrated drive chip on one side of the display area away from the display surface, thereby greatly reducing a frame area of the display panel.

According to the display panel and the display apparatus provided in embodiments of the present disclosure, at least one shield line is arranged, and the orthographic projections of the shield lines on the substrate are located between the orthographic projections of the touch leads on the substrate and the orthographic projections of the data leads on the substrate, such that the electric field generated by the touch leads may be shielded, and coupling capacitance is prevented from being formed between the touch leads and the data leads, thereby relieving mutual interference between the touch signals and the data signals, and further improving the display effect and the touch effect of the display panel. Moreover, the at least two shield lines in the display panel are connected in a shorted manner, such that the number of the connection terminals needing to be connected to the shield lines in the display panel may be reduced, the number of the signal lines at the edge of the display panel easily matches the number of the connection terminals in the binding area, and the display panel is easier to wire.

Although the preferred embodiments of the present disclosure have been described, those skilled in the art may make additional changes and modifications to these embodiments once they learn the basic inventive concept. Therefore, the appended claims are intended to be interpreted as including the preferred embodiments and all changes and modifications falling within the scope of the present disclosure.

Apparently, those skilled in the art may make various modifications and variations to the embodiments of the present disclosure without departing from the spirit and scope of the embodiments of the present disclosure. In this way, if these modifications and variations of the present disclosure fall within the scope of the claims of the present disclosure and their equivalent technologies, the present disclosure is also intended to include these modifications and variations.

What is claimed is:

1. A display panel, comprising: a display area and a peripheral area located on at least one side of the display area, and the display panel further comprising:
    a substrate;
    a plurality of touch electrodes, at least parts of the touch electrodes being on the substrate in the display area;
    a plurality of touch leads located on the substrate, one end of the touch leads being coupled to the touch electrodes, and the other end of the touch leads being located in the peripheral area;
    a plurality of data leads located on the substrate in the peripheral area; and
    a plurality of shield lines located on the substrate in the peripheral area, orthographic projections of the shield lines on the substrate being located between orthographic projections of the touch leads on the substrate and orthographic projections of the data leads on the substrate, and at least two of the plurality of shield lines being connected to each other in a shorted manner;
    wherein the shield lines that are connected to each other in a shorted manner are connected in a shorted manner by connection lines;
    wherein the connection lines and the shield lines are on a same film layer, and the connection lines do not cross remaining shield lines except the shield lines connected to the connection lines in a shorted manner;
    wherein the plurality of touch leads in the display panel are divided into a plurality of touch lead groups, and each of the touch lead groups comprises more than one of the plurality of touch leads:
    the plurality of data leads in the display panel are divided into a plurality of data lead groups, each of the data lead groups comprises more than one of the plurality of data leads, and at least some of the touch lead groups and the data lead groups are alternately distributed; and
    the shield lines are in gaps between the touch lead groups and the data lead groups;
    wherein the plurality of shield lines in the display panel comprise a plurality of ground lines,
    at least one of the ground lines being arranged in a gap between the touch lead group and the data lead group that are adjacent to each other;
    wherein the plurality of shield lines in the display panel further comprise: a plurality of floating touch leads,
    at least one of the floating touch leads being arranged in the gap between the touch lead group and the data lead group that are adjacent to each other, and the floating touch leads being between the ground lines and the touch lead groups.

2. The display panel of claim 1, wherein in the peripheral area, the plurality of data leads in the display panel are divided into a plurality of first data leads located on a first metal layer and a plurality of second data leads located on a second metal layer; the second metal layer is located on one side close to the substrate, of the first metal layer; and orthographic projections of the first data leads on the substrate and orthographic projections of the second data leads on the substrate are alternately distributed.

3. The display panel of claim 2, wherein the touch shield lines in the display panel comprise: a first touch shield line and a second touch shield line,
    the second touch shield line being on one side close to the touch electrode, of the first touch shield line.

4. The display panel of claim 3, wherein the first touch shield line comprises a first touch shield sub-line and at least two second touch shield sub-lines,
    the first touch shield sub-line being in the second peripheral area, the third peripheral area and the fourth peripheral area, and the second touch shield sub-lines being coupled to the first touch shield sub-line, and being in the first peripheral area.

5. The display panel of claim 4, wherein a width of the first touch shield line is greater than a width of the second touch shield lines in the second peripheral area, the third peripheral area and the fourth peripheral area.

6. The display panel of claim 1, wherein the peripheral area comprises a first fan-out area, a second fan-out area located on one side away from the display area, of the first fan-out area, and a bending area located between the first fan-out area and the second fan-out area,
    the floating touch leads being in at least one of the first fan-out area, the bending area or the second fan-out area, and
    the ground lines being in the second fan-out area.

7. The display panel of claim 6, wherein each of the shield lines in the gap between the touch lead group and the data lead group that are adjacent to each other is taken as a shield line group; and in two adjacent shield line groups, each of the ground lines is in a gap formed by each of the floating touch leads.

8. The display panel of claim 7, wherein in two adjacent shield line groups, the ground lines in each of the shield line groups are sorted in sequence from a closer distance to the floating touch leads in the shield line group to a farther distance to same; and
    in two adjacent shield line groups, an i-th ground line in one of the two adjacent shield line groups is connected to an i-th ground line in the other one of the two adjacent shield line groups in a shorted manner by means of the connection line, wherein the i-th ground line in one of the two adjacent shield line groups, the i-th ground line in the other one of the two adjacent shield line groups and the connection line are on a same film layer, i being a positive integer greater than 0 and less than or equal to a total number of the ground lines in the shield line groups, and the connection line connected to the i-th ground line being on one side, close to the first fan-out area, of the connection line connected to the (i+1)-th ground line.

9. The display panel of claim 7, wherein in two adjacent shield line groups, the floating touch leads in each of the shield line groups are sorted in sequence from a closer distance to the ground lines in the shield line group to a farther distance to same; and
    in two adjacent shield line groups, the first floating touch lead in one of the two adjacent shield line groups is connected to the first floating touch lead in the other one of the two adjacent shield line groups in a shorted manner by means of the connection line, wherein the first floating touch lead in one of the two adjacent shield line groups, the first floating touch lead in the other one of the two adjacent shield line groups and the connection line are on a same film layer, and a j-th floating touch lead in one of the two adjacent shield line groups is connected to a j-th floating touch lead in the other one of the two adjacent shield line groups in a shorted manner by means of a connection wire, wherein the j-th floating touch lead in one of the two adjacent shield line groups, the j-th floating touch lead in the other one of the two adjacent shield line groups and the connection wire are on a different layer, j being a positive integer greater than 1 and less than or equal to a total number of the ground lines in the shield line groups.

10. The display panel of claim 6, further comprising: a plurality of first electrodes, a plurality of second electrodes located on one side, away from the substrate, of the first electrodes, and a light-emitting layer located between the first electrodes and the second electrodes, wherein
orthographic projections of the floating touch leads on the substrate overlaps with orthographic projections of the second electrodes on the substrate, and the orthographic projections of the floating touch leads on the substrate do not overlap with orthographic projections of the touch electrodes on the substrate.

11. The display panel of claim 1, further comprising: a plurality of connection terminals located on the substrate in the peripheral area, wherein
the touch leads, the data leads and the shield lines are electrically connected to different connection terminals respectively.

12. The display panel of claim 11, wherein the at least two shield lines that are connected to each other in a shorted manner are electrically connected to a same connection terminal.

13. The display panel of claim 1, further comprising: touch shield lines located on the substrate, wherein the peripheral area comprises: a first peripheral area and a second peripheral area that are oppositely arranged, and a third peripheral area and a fourth peripheral area that are oppositely arranged, the shield lines being located in the first peripheral area; and
first ends and second ends of the touch shield lines are in the first peripheral area, and the touch shield lines pass through the second peripheral area, the third peripheral area and the fourth peripheral area, and surround the touch electrodes in the display panel.

14. A display apparatus, comprising: the display panel of claim 1.

* * * * *